United States Patent
Liu et al.

(10) Patent No.: US 9,989,608 B2
(45) Date of Patent: Jun. 5, 2018

(54) MAGNETIC RESONANCE IMAGING METHOD AND APPARATUS

(71) Applicant: Siemens Aktiengesellschaft, Munich (DE)

(72) Inventors: Wei Liu, Shenzhen (CN); Kun Zhou, Shenzhen (CN)

(73) Assignee: Siemens Aktiengesellschaft, Munich (DE)

(*) Notice: Subject to any disclaimer, the term of this patent is extended or adjusted under 35 U.S.C. 154(b) by 754 days.

(21) Appl. No.: 14/630,933

(22) Filed: Feb. 25, 2015

(65) Prior Publication Data

US 2015/0241531 A1 Aug. 27, 2015

(30) Foreign Application Priority Data

Feb. 26, 2014 (CN) .......................... 2014 1 0067094

(51) Int. Cl.
*G01R 33/50* (2006.01)
*G01R 33/561* (2006.01)
*G01R 33/24* (2006.01)

(52) U.S. Cl.
CPC ............ *G01R 33/50* (2013.01); *G01R 33/246* (2013.01); *G01R 33/5613* (2013.01); *G01R 33/5616* (2013.01)

(58) Field of Classification Search
CPC .. G01R 33/50; G01R 33/246; G01R 33/5613; G01R 33/5616
See application file for complete search history.

(56) References Cited

U.S. PATENT DOCUMENTS

| | | | |
|---|---|---|---|
| 7,038,453 B2* | 5/2006 | Feiweier | G01R 33/583 324/309 |
| 7,800,368 B2* | 9/2010 | Vaughan | G01R 33/583 324/318 |
| 7,990,149 B2* | 8/2011 | Zhai | G01R 33/34046 324/322 |

* cited by examiner

*Primary Examiner* — Dixomara Vargas
(74) *Attorney, Agent, or Firm* — Schiff Hardin LLP

(57) ABSTRACT

In an MRI method and apparatus a BLOCH-SIEGERT method is used to establish a scaling factor of an excitation magnetic field that excites nuclei in a subject. A method involving two flip angles is executed to obtain a spatial distribution of longitudinal relaxation times of the excited nuclei so as to reconstruct a longitudinal relaxation time spatial distribution image, wherein the scaling factor is used to correct the two flip angles. This MRI method and apparatus cannot only obtain the spatial distribution of an excitation magnetic field accurately, but also can greatly reduce scan time, while ensuring a similar image resolution and image signal-to-noise ratio.

8 Claims, 1 Drawing Sheet

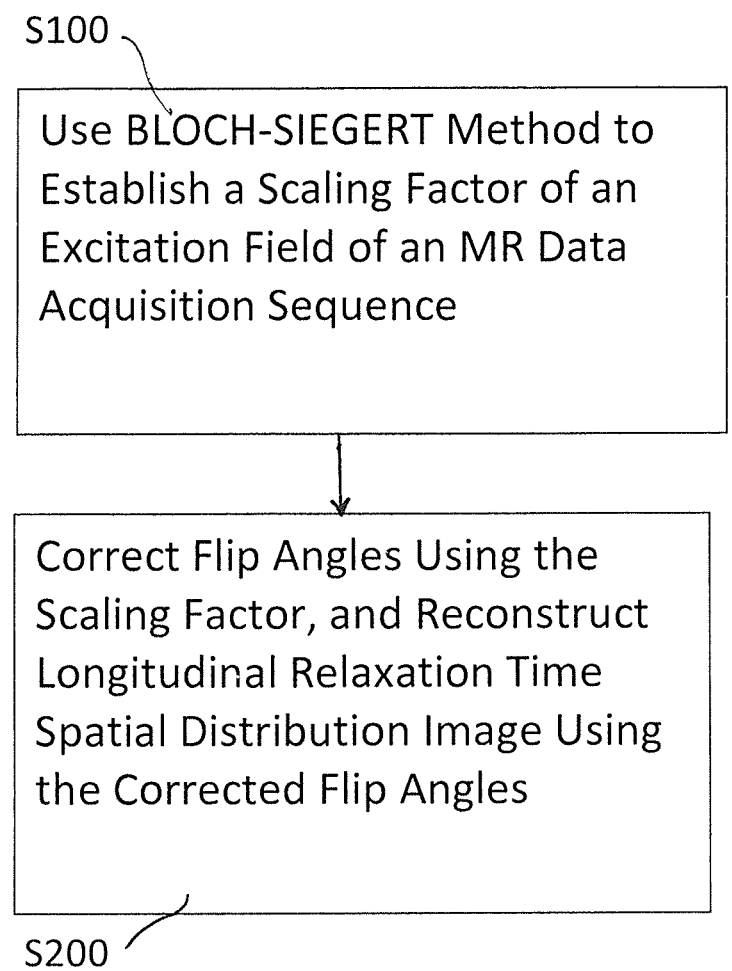

MAGNETIC RESONANCE IMAGING METHOD AND APPARATUS

BACKGROUND OF THE INVENTION

Field of the Invention

The present invention relates to a magnetic resonance imaging (MRI) method and apparatus, in particular to a longitudinal relaxation time MRI method and apparatus.

Description of the Prior Art

MRI is an imaging technology involving biomagnetics and nuclear spin that has advanced rapidly with the development of computer technology, electronic circuit technology and superconductor technology. In MRI, human body tissue is positioned in a static magnetic field $B_0$, then a radio frequency (RF) pulse with a frequency equal to the precession frequency of hydrogen atomic nuclei is used to excite the hydrogen nuclei by producing an excitation field $B_1$ in the body tissue, giving rise to resonance in the hydrogen nuclei, with the absorption of energy. When the RF pulse has stopped, the hydrogen nuclei have been deflected (flipped) from an orientation along the filed lines of the $B_0$ field, and as they return to that orientation they emit radio signals at a specific frequency, releasing the absorbed energy. These signals are received and recorded by a receiver outside the body, and processed by computer to obtain an image.

Non-uniformity of the excitation magnetic field $B_1$ in a high-field MRI system often leads to inconsistency between the actual flip angle (FA) and the nominal (expected) flip angle, and this in turn has a serious impact on qualitative and quantitative analysis of the magnetic resonance image such that the diagnosis result is negatively affected. Because the linear relationship between the excitation magnetic field $B_1$ and the RF pulse flip angle is generally determined by analysis or BLOCH simulation, a stable and accurate map of the spatial distribution of the excitation magnetic field $B_1$ is important to rectifying the effect mentioned above (the inconsistency between the actual flip angle and nominal flip angle).

SUMMARY OF THE INVENTION

In view of the above, the present invention concerns an MRI method that includes the following steps.

Using a BLOCH-SIEGERT method to establish a scaling factor of an excitation magnetic field that excites nuclei in a subject, and a method involving two flip angles is implemented to obtain a spatial distribution of longitudinal relaxation times of the excited nuclei, so as to reconstruct a longitudinal relaxation time spatial distribution image, wherein the scaling factor is used to correct the two flip angles. The computer that establishes the scaling factor may be the same computer as the image reconstruction computer, or they may respectively be individual processors of a distributed computer system.

Preferably, the step of using a BLOCH-SIEGERT method to establish a scaling factor of an excitation magnetic field is implemented by emitting an imaging sequence so as to acquire an actual value spatial distribution of an excitation magnetic field, and using the ratio of a nominal value spatial distribution of the excitation magnetic field to the actual value spatial distribution to establish the scaling factor, wherein the imaging sequence uses an off-resonance RF pulse immediately following an excitation pulse of the imaging sequence.

Preferably, the imaging sequence is a multi-shot SE-EPI sequence to acquire the spatial distribution of actual values of the excitation magnetic field.

Preferably, the off-resonance RF pulse is a Fermi pulse or a hard pulse.

The present invention also concerns an MRI apparatus that has a scaling factor establishment unit that uses a BLOCH-SIEGERT method to establish a scaling factor of an excitation magnetic field that excites nuclei in a subject, an image reconstruction unit that executes a method involving two flip angles to obtain a spatial distribution of the longitudinal relaxation times of the excited nuclei so as to reconstruct a longitudinal relaxation time spatial distribution image, wherein the image reconstruction unit is also for using the scaling factor to correct the two flip angles.

Preferably, the scaling factor establishment unit has a sequence emitting component that emits an imaging sequence so as to acquire an actual value spatial distribution of an excitation magnetic field, and a calculation component that uses the ratio of a nominal value spatial distribution of the excitation magnetic field to the actual value spatial distribution to establish the scaling factor, wherein the imaging sequence has an off-resonance RF pulse immediately following an excitation pulse of the imaging sequence.

Preferably, the imaging sequence is a multi-shot SE-EPI sequence to acquire the spatial distribution of actual values of the excitation magnetic field.

Preferably, the off-resonance RF pulse is a Fermi pulse or a hard pulse.

The MRI method and apparatus according to the embodiments of the present invention can not only obtain the spatial distribution of an excitation magnetic field accurately, but also can greatly reduce scan time, while ensuring a similar image resolution and image signal-to-noise ratio.

BRIEF DESCRIPTION OF THE DRAWINGS

The single FIGURE is a flowchart of an embodiment of the MRI method according to the present invention.

DESCRIPTION OF THE PREFERRED EMBODIMENTS

The present invention is explained in further detail below by way of embodiments that clarify the object, technical solution and advantages thereof.

The FIGURE shows a flowchart of the steps of the MRI method according to an embodiment of the present invention. As shown in the FIGURE, the MRI method according to this particular embodiment includes, instep S100, using a BLOCH-SIEGERT method to establish a scaling factor of an excitation magnetic field. In step S200, a method involving two flip angles is implemented to obtain a spatial distribution of the relaxation times of the nuclei that were excited in step S100. The scaling factor of the excitation magnetic field is used in step S200 to correct two flip angles. The acquisition of the spatial distribution of longitudinal relaxation times of the nuclei by the MRI method according to a particular embodiment of the present invention is described step by below.

The BLOCH-SIEGERT (BS) method is a method of measuring accurately the spatial distribution of the excitation magnetic field, and is relatively stable with regard to repetition time, longitudinal relaxation time, flip angle, chemical shift, non-uniformity of external magnetic field and magnetization transfer. The BS method exploits a phenomenon whereby the resonance frequency of hydrogen atoms experiences a shift when an off-resonance RF field is applied to these hydrogen atoms; this phenomenon is due to the off-resonance part of the RF field, which makes an additional contribution to the static magnetic field. This being the case, if the off-resonance RF field applied has a sufficiently large off-resonance frequency and/or a pulse waveform that is incapable of giving rise to spin excitation, the spin will not be excited but simply experience a change in precession frequency. The spin precession frequency shifts from the off-resonance radiating point, and depends upon the amplitude of the excitation magnetic field and the difference between the spin resonance frequency and the RF frequency. However, due to the limitations of this BS method in terms of RF energy absorption rate (SAR, specific absorption rate), as well as its long measuring time, its use is restricted in practical applications.

Specifically, applying the BS method to the spatial distribution of the excitation magnetic field comprises: emitting an off-resonance RF pulse with a frequency $\omega_{RF}$ immediately after an excitation pulse in an imaging sequence. The shape and frequency of the off-resonance RF pulse are chosen such that they will not excite spin in the examination subject; the off-resonance RF pulse is for example a Fermi pulse, a hard pulse, etc. During the off-resonance RF pulse, a change in the spin precession frequency causes an image phase shift $\varnothing_{BS}$, and can therefore be used to measure the spatial distribution of actual values B1 of the excitation magnetic field. The spatial distribution of phase shifts $\varnothing_{BS}$ and the spatial distribution of actual values B1 of the excitation magnetic field are as shown in equation [1] below, wherein the phase shift $\varnothing_{BS}$ is a variable with spatial position as a parameter and can be learned from a magnetic resonance image, and KBS is a constant for the specific off-resonance RF pulse (for example, when the off-resonance RF pulse is a Fermi pulse with a frequency of 4 KHz, KBS is 14.23 rad/G2; the off-resonance RF pulse may also be a hard pulse). The spatial distribution of actual values B1 of the excitation magnetic field can be determined by:

$$\Phi_{BS} = B_1^2 \times K_{BS} \quad [1]$$

Once the spatial distribution of actual values $B_1$ of the excitation magnetic field has been determined, the spatial distribution of actual values $B_1$ of the excitation magnetic field is divided by the spatial distribution of nominal values $B_{1,nominal}$ of the excitation magnetic field (i.e. the theoretical value of the peak value of the excitation magnetic field) of the off-resonance RF pulse applied in the imaging sequence, in order to obtain a scaling factor $\beta(x)$ for the spatial distribution of the excitation magnetic field in an actual scan. Here, $\beta(x)$ is the scaling factor between the actual value and nominal value of the excitation magnetic field corresponding to a spatial position x in a magnetic resonance image. For example, when $\beta(x)$ equals 1, the actual value and nominal value of the excitation magnetic field at that position can be considered to be equal, i.e. no error has arisen. Thus $\beta(x)$ is shown by formula [2].

$$\beta(x) = B_1 / B_{1,nominal} \quad [2]$$

By optimizing the image acquisition sequence, the scan time and SAR can both be reduced effectively; for example, a single-shot GRE-EPI sequence or TSE sequence can be used to reduce the number of off-resonance RF pulses for each image layer in the BS method. To summarize, the spatial distribution image of actual values $B_1$ of the excitation magnetic field generated by a TSE sequence has a high signal-to-noise ratio but the SAR is also high, whereas the spatial distribution image of actual values $B_1$ of the excitation magnetic field generated by a single-shot GRE-EPI sequence has a low signal-to-noise ratio but the SAR is also low.

The MRI method according to this embodiment uses a multi-shot SE-EPI sequence in the BS method to establish the scaling factor $\beta(x)$ of the spatial distribution of the excitation magnetic field; this enables a higher image signal-to-noise ratio, shorter scan time, higher image resolution and lower SAR to be obtained. Specifically, compared with a BS method using a single-shot GRE-EPI sequence, if the MRI method according to this particular embodiment uses a multi-shot SE-EPI sequence in the BS method then the scan time can be greatly reduced, while ensuring a similar image resolution and image signal-to-noise ratio; compared with a BS method using a TSE sequence, if the MRI method according to this particular embodiment uses a multi-shot SE-EPI sequence in the BS method then the scan time and SAR can be reduced.

A method involving two flip angles is executed to obtain a spatial distribution of relaxation times T1, wherein first of all a Spoiled-FLASH (spoiled fast low angle shot) is used to obtain magnetic resonance image signal intensities $SI_1(x)$ and $SI_2(x)$ at spatial position x for two flip angles $\theta_1$ and $\theta_2$, as shown in equations [3] and [4]. Here, $M_0(x)$ is the initial magnetization at spatial position x, TR is the repetition time, $T1(x)$ is the longitudinal relaxation time at spatial position x, TE is the echo time, and $T2^*(x)$ is the modulated transverse relaxation time at spatial position x.

$$SI_1(x) = \frac{M_0(x)\sin\theta_1(1-e^{-TR/T1(x)})}{(1-\cos\theta_1 e^{-TR/T1(x)})} e^{-TE/T2^*(x)} \quad [3]$$

$$SI_2(x) = \frac{M_0(x)\sin\theta_2(1-e^{-TR/T1(x)})}{(1-\cos\theta_2 e^{-TR/T1(x)})} e^{-TE/T2^*(x)} \quad [4]$$

On the basis of equations [3] and [4], the distribution of relaxation times T1 by spatial position x can be obtained, using equation [5], wherein $Q(x)=SI_1(x)/SI_2(x)$.

$$T_1(x) = \frac{TR}{\ln\left(\frac{\sin\theta_1\cos\theta_2 - Q(x)\sin\theta_2\cos\theta_1}{\sin\theta_1 - Q(x)\sin\theta_2}\right)} \quad [5]$$

Further, the scaling factor $\beta(x)$ is used to correct the two flip angles $\theta_1$ and $\theta_2$, to obtain two corrected flip angles $\theta'_1$ and $\theta'_2$. Specifically, formulas [6] and [7] are used to obtain two corrected flip angles $\theta'_1$ and $\theta'_2$. The two corrected flip angles $\theta'_1$ and $\theta'_2$ are then used to obtain the distribution of relaxation times T1 by spatial position x based on equation [5].

$$\theta'_1 = \beta(x)\theta_1 \quad [6]$$

$$\theta'_2 = \beta(x)\theta_2 \quad [7]$$

The accuracy of a spatial distribution image of longitudinal relaxation times reconstructed by the MRI method according to a particular embodiment of the present invention is increased greatly.

Based on the method in the present invention of using a BLOCH-SIEGERT method to establish an excitation magnetic field scaling factor, image intensity variation caused by non-uniformity in the excitation magnetic field $B_1$ can also be corrected. To simplify this process, this correction must satisfy either one of the following two points:

1) In the imaging sequence, a sequence with a relatively long repetition time TR is used to obtain an image. When a sequence with a relatively long repetition time TR, for example an EPI-related sequence, is used to obtain an image, the dependence of the image signal intensity on longitudinal relaxation time T1 is relatively low because the repetition time TR is far greater than the longitudinal relaxation time T1.

2) A detection region with relatively small variation in longitudinal relaxation time T1 is selected. In this detection region, for example the brain, where the variation in longitudinal relaxation time T1 is relatively small, the signal intensity may be approximately expressed as a function based on the average T1.

In the above two cases, a similar T1 correction method can be used to correct the image signal intensity. Taking the second case as an example, if Spoiled-FLASH is used to obtain a magnetic resonance signal image of the head, formulas [8] and [9] can be used to obtain a corrected image signal. Here, the scaling factor β(x) corrects the flip angle θ(x), the corrected flip angle is θ'(x), and $SI_{measured}(x)$ and $SI_{corrected}(x)$ are the magnetic resonance image signal intensities at spatial position x before and after correction, respectively. $T_{1,average}$ is the average T1 value in the head detection region.

$$SI_{corrected}(x) = \frac{SI_{measured}(x)\sin\theta'(x)\left(1 - \cos\theta(x)e^{-TR/T_{1,average}}\right)}{\sin\theta(x)\left(1 - \cos\theta'(x)e^{-TR/T_{1,average}}\right)\beta(x)}. \quad [8]$$

$$\theta'(x) = \beta(x)\theta'(x) \quad [9]$$

The reconstructed image is made available as a data file at an output of the image reconstruction computer in which the above-described reconstruction algorithm is executed.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance imaging method, comprising:
operating a magnetic resonance data acquisition unit, while a subject is situated therein, to acquire magnetic resonance data from said examination subject by executing an imaging sequence in said magnetic resonance data acquisition unit comprising radiation of at least two radio-frequency pulses, at respective flip angles, that produce an excitation field that influences a longitudinal relaxation time of nuclear spins in the subject;
in said imaging sequence, using a BLOCH-SIEGERT method to establish a scaling factor of said excitation magnetic field;
providing said magnetic resonance data and said scaling factor to a computer and, in said computer, reconstructing a longitudinal relaxation time spatial distribution image of said subject using a reconstruction algorithm wherein two of said flip angles are used to obtain a spatial distribution of longitudinal relaxation times in the subject, and using said scaling factor to correct said two flip angles; and
making the reconstructed longitudinal relaxation time spatial distribution image available in electronic form at an output of said computer as a data file.

2. A method as claimed in claim 1 comprising:
using said BLOCH-SIEGERT method to establish said scaling factor of said excitation magnetic field by operating said magnetic resonance data acquisition unit, which said subject is situated therein, to radiate an off-resonance radio-frequency pulse, which does not excite nuclear spins in the subject, immediately following radiation of an excitation pulse in said imaging sequence; and
in said computer, using a ratio of an actual value of a spatial distribution of said excitation magnetic field to a nominal value of said spatial distribution of said excitation field to establish said scaling factor.

3. A method as claimed in claim 2 comprising acquiring said spatial distribution of said actual values of said excitation magnetic field using a multi-shot SE-EPI sequence as said imaging sequence.

4. A method as claimed in claim 2 comprising radiating said off-resonance RF pulse as a pulse selected from the group consisting of a Fermi pulse and a hard pulse.

5. A magnetic resonance imaging apparatus, comprising:
a magnetic resonance scanner;
a control computer configured to operate said magnetic resonance scanner, while a subject is situated therein, to acquire magnetic resonance data from said examination subject by executing an imaging sequence in said magnetic resonance data acquisition unit comprising radiation of at least two radio-frequency pulses, at respective flip angles, that produce an excitation field that influences a longitudinal relaxation time of nuclear spins in the subject;
said control computer being configured to use, in said imaging sequence, a BLOCH-SIEGERT method to establish a scaling factor of said excitation magnetic field;
said control computer being configured to reconstruct a longitudinal relaxation time spatial distribution image of said subject using a reconstruction algorithm wherein two of said flip angles are used to obtain a spatial distribution of longitudinal relaxation times in the subject, and using said scaling factor to correct said two flip angles; and
said control computer being configured to make the reconstructed longitudinal relaxation time spatial distribution image available in electronic form at an output of said control computer as a data file.

6. An apparatus as claimed in claim 5 comprising:
said control computer being configured to use said BLOCH-SIEGERT method to establish said scaling factor of said excitation magnetic field by operating said magnetic resonance data acquisition unit, which said subject is situated therein, to radiate an off-resonance radio-frequency pulse, which does not excite nuclear spins in the subject, immediately following radiation of an excitation pulse in said imaging sequence; and
said control computer being configured to use a ratio of an actual value of a spatial distribution of said excitation magnetic field to a nominal value of said spatial distribution of said excitation field to establish said scaling factor.

7. An apparatus method as claimed in claim 6 wherein said control computer is configured to operate said magnetic resonance scanner using a multi-shot SE-EPI sequence as said imaging sequence.

8. An apparatus as claimed in claim 6 wherein said control computer is configured to operate said magnetic resonance scanner to radiate said off-resonance RF pulse as a pulse selected from the group consisting of a Fermi pulse and a hard pulse.

* * * * *